United States Patent
Andrus et al.

[19]

[11] Patent Number: 5,987,740
[45] Date of Patent: Nov. 23, 1999

[54] LASER MACHINING OF MOLDED ASSEMBLIES

[75] Inventors: Lance L. Andrus, Southboro; Jeffrey A. Curhan, Medway, both of Mass.

[73] Assignee: VLT Corporation, San Antonio, Tex.

[21] Appl. No.: 08/735,227

[22] Filed: Oct. 22, 1996

[51] Int. Cl.$^6$ ...................................................... H05K 3/30
[52] U.S. Cl. ............................ 29/841; 29/840; 174/52.1; 174/16.3; 174/252; 361/709
[58] Field of Search ............................. 29/832, 840, 841; 174/16.3, 52.1, 252; 361/709

[56] References Cited

U.S. PATENT DOCUMENTS

| | | |
|---|---|---|
| 3,676,745 | 7/1972 | Traweek . |
| 5,323,295 | 6/1994 | Pines . |
| 5,365,403 | 11/1994 | Vinciarelli et al. . |
| 5,367,439 | 11/1994 | Griffin et al. . |
| 5,467,251 | 11/1995 | Katchmar . |
| 5,644,103 | 7/1997 | Pullen et al. . |

FOREIGN PATENT DOCUMENTS

| | | | |
|---|---|---|---|
| 4-291749 | 10/1992 | Japan | H01L 23/29 |
| 5-243457 | 9/1993 | Japan | H01L 23/50 |
| 2177965 | 2/1987 | United Kingdom . | |

OTHER PUBLICATIONS

Howard Green et al., "Reducing MCM Fabrication Costs", Electronic Packaging & Production, pp. 50–54, May 1996.
Roland Heitmann, "The Ultimate Connections: BGA and Flip Chip Attachment", Electronic Packaging and Production, pp. 67–76, Electronic Packaging & Production, May 1996.
Charles Bauer, "Package Assembly Technology Directions", Electronic Packaging & Production, pp. 79–82, May 1996.
U.S. Patent Appln. Serial No. 08/077,011, filed Jun. 14, 1993, "Packaging Electrical Components".
U.S. Patent Appln. Serial No. 08/337,269, filed Nov. 10, 1994, "Packaging Electrical Components".
Proceedings of 1996 International Electronics Packaging Conf. pp. 192–202 by T. Leniham et al, Published by Electron. Packaging Soc. Sep. 29–Oct. 1, 1996.

*Primary Examiner*—Carl J. Arbes
*Attorney, Agent, or Firm*—Fish & Richardson P.C.

[57] ABSTRACT

A heat generating component is encapsulated within an encapsulant. A window is made in the encapsulant to expose a heat dissipating surface of the component and a heat sinking device is attached to the heat dissipating surface of the heat generating component. The window is formed using a laser.

17 Claims, 11 Drawing Sheets

LASER MACHINING OF MOLDED ASSEMBLIES

BACKGROUND

This invention relates to laser machining of molded assemblies.

The operating temperature of an electronic component, relative to the temperature of a heat sinking medium, depends upon the amount of heat generated by the component and the thermal conductivities of the paths between the component and the heat sinking medium. For example, FIG. 1 shows an exploded view of a DC-DC converter module or modular power converter 100 which includes an overmolded control assembly 44 (see, for example, "Power Converter Configuration, Control and Construction," U.S. patent application Ser. No. 08/077,011, filed Jun. 17, 1993, and "Packaging Electrical Components," U.S. Pat. No. 5,365,403, both incorporated herein by reference). A metallic baseplate 52 is provided for removing heat from the assembly. Metal shields 27, which are tightly thermally coupled to, but electrically insulated from, the baseplate 52, serve to reduce the thermal resistance between power dissipating components 66 and the baseplate (see "Packaging Electrical Components," U.S. patent application Ser. No. 08/337,269, filed Nov. 10, 1994, incorporated herein by reference). When assembled, the interior of the module is filled with an encapsulating material which helps to conduct heat from other internal components to the baseplate. In such an assembly, the operating temperature of heat dissipating components within the control assembly 44 will depend upon the thermal conductivities of the paths between the components and the baseplate.

One way to reduce the temperature differential between a heat sinking surface and a heat dissipating component is to provide a conductive metal path between the heatsink and the component.

SUMMARY

In general, in one aspect, the invention features encapsulating a heat generating component within an encapsulant, making a window in the encapsulant to expose a heat dissipating surface of the component, and attaching a heat sinking device to the heat dissipating surface of the heat generating component.

Implementations of the invention may include one or more of the following features. The window is made by laser cutting the encapsulant in a predetermined pattern, which may include a perimeter cut that outlines the area of encapsulant to be removed, a pattern of parallel strokes for removing strips of the encapsulant, and a pattern of parallel strokes for cleaning the surface of the heat generating component. The laser may be an AB stroke marking laser. A bevel may also be cut along an edge of the window.

The heat sinking device is metal such as copper and may have a dimple with dimensions similar to those of the window in the encapsulant.

The heat sinking device is attached using metal-laden epoxy, or solder. The free end of the heat sinking device is soldered to a ground.

In general, in another aspect, the invention features any scheme for laser-cutting a window in the encapsulant of an encapsulated heat generating component.

In general, in another aspect, the invention features coating a heat generating component with mold release material (such as PTFE), encapsulating the heat generating component with an encapsulant, and making a window in the encapsulant to expose a heat dissipating surface of the heat dissipating compound.

In implementations of the invention, the outlined area of encapsulant is removed from the surface of the heat generating component by passing compressed air over the surface of the encapsulant until the encapsulant dislodges from the heat generating component.

In general, in another aspect, the invention features encapsulating a component with a heat dissipating surface of the component lying in the vicinity of an exposed surface of an encapsulant, and removing a layer at the surface of the encapsulant to expose the heat dissipating surface bounded by a fresh surface of the encapsulant.

In implementations of the invention, the fresh surface of the encapsulant is recessed below the heat dissipating surface. A heat sinking element is bonded to the fresh surface with the heat sinking element in contact with the heat dissipating surface.

In general, in another aspect, the invention features a method for use with an encapsulated circuit module. The method includes trimming a face of the module using a laser.

Implementation of the invention may include one or more of the following. The encapsulated circuit may be formed by a mold, and the trimming may include removing molded flashing from the module. The trimming may include removing a portion of the encapsulated circuit module in a plane substantially parallel to the molded flashing. The trimming may include trimming opposite parallel faces of the module to achieve a predetermined dimensional tolerance. The encapsulated circuit module may be formed on a circuit board, and the method may also include punching the circuit module from the board after trimming. The encapsulated circuit module may be one of a plurality of encapsulated circuit modules formed on a circuit board, and the method may also include trimming the other encapsulated circuit modules using the laser and punching the encapsulated circuit modules from the board after the trimming the other encapsulated circuit modules.

In general, in another aspect, the invention features a method for use with an encapsulated circuit module formed on a circuit board. The method includes cutting through a portion of the circuit board using a laser.

Implementations of the invention may include one or more of the following. The cutting may include separating the encapsulated circuit module from a nonencapsulated section of the circuit board.

Advantages of the invention may include one or more of the following. Laser exfoliation provides a quick and precise method for creating a window in the encapsulant. Removing encapsulant from adjacent a heat-dissipating surface of a component, to form a window above the heat-dissipating surface, and coupling a thermally conductive drain directly to that surface, improves the transfer of heat from the component to the drain. A dimple in the thermally conductive drain that is similar in dimension to the size of the window allows the surface of the heat sink to be attached to the surface of the heat generating component. Thermally conductive epoxy attaches the drain to the surface of the heat generating component. A free end of the drain may be thermally coupled to a baseplate, or similar heat removal surface or medium, to channel heat away from the component.

Cutting a window in the encapsulant with a laser avoids flash problems because the laser has no specific tolerance requirements for the size of the part or for the location of the part with respect to the laser. A variety of laser patterns may be used depending upon the application and the geometric configuration of the encapsulated component. An initial perimeter cut where the laser outlines the area of encapsulant to be removed and thermally isolates the area from the rest of the encapsulant. Thermal isolation prevents the rest of the encapsulant from being affected by the expansion of the portion of encapsulant within the perimeter cut during laser exfoliation. Thermal isolation reduces the effect the laser has upon the encapsulant outside of the perimeter cut, and intensifies the effect the laser has upon the encapsulant contained within the perimeter cut.

Coating the heat generating component with a mold release material before applying the encapsulant reduces the number of laser patterns necessary to create a window in the encapsulant. Once a perimeter cut has been made with the laser the encapsulant within the perimeter can be peeled away from the surface of the heat generating component because the mold release material prevents the encapsulant from bonding with the surface of the component.

Less expensive molds may be used. The tolerance of the finished part may be precisely controlled.

Other features and advantages will become apparent from the following description and from the claims.

DESCRIPTION

Figure 1:
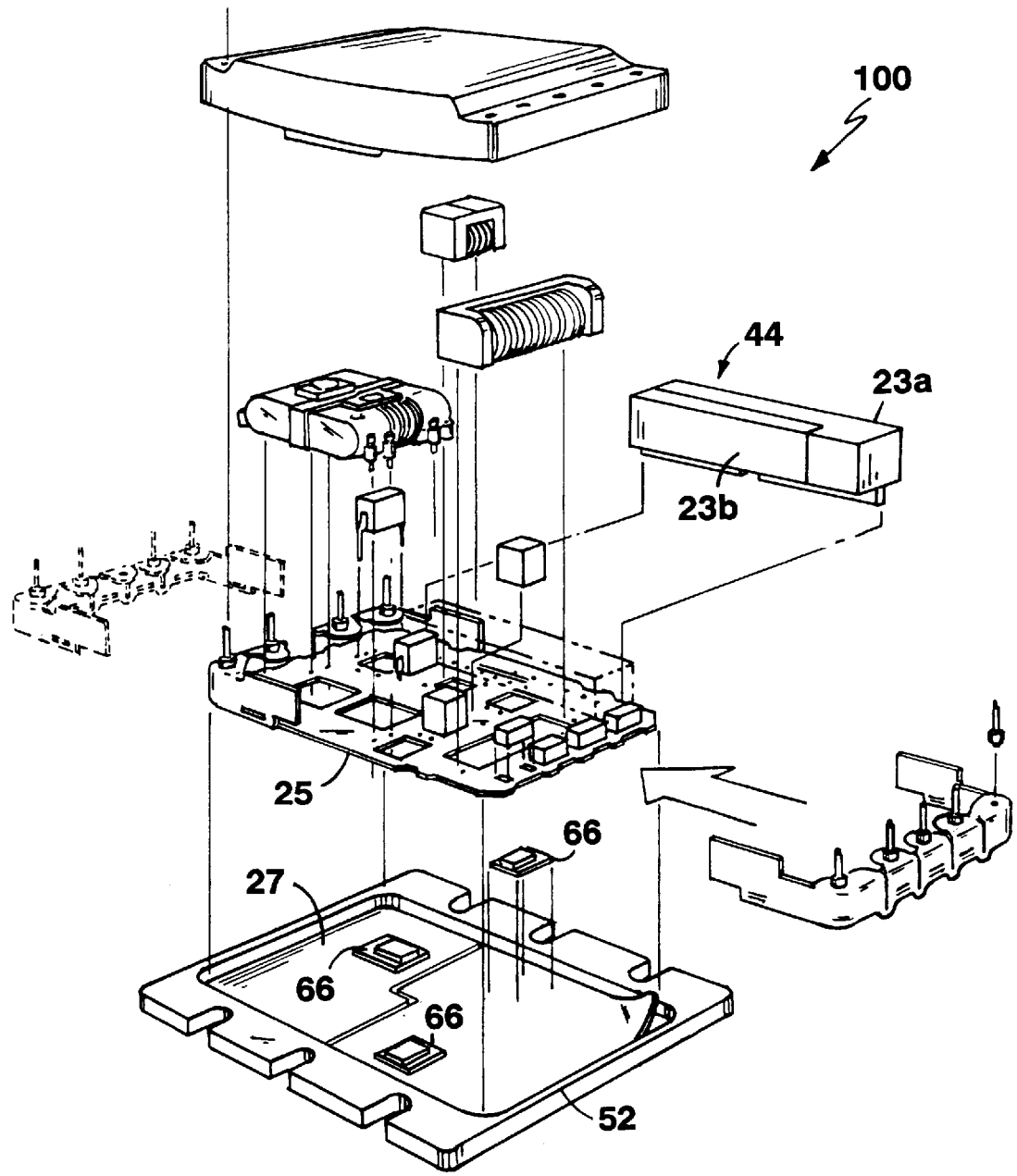
FIG. 1 is an exploded perspective view of a modular power converter.
Figure 2:
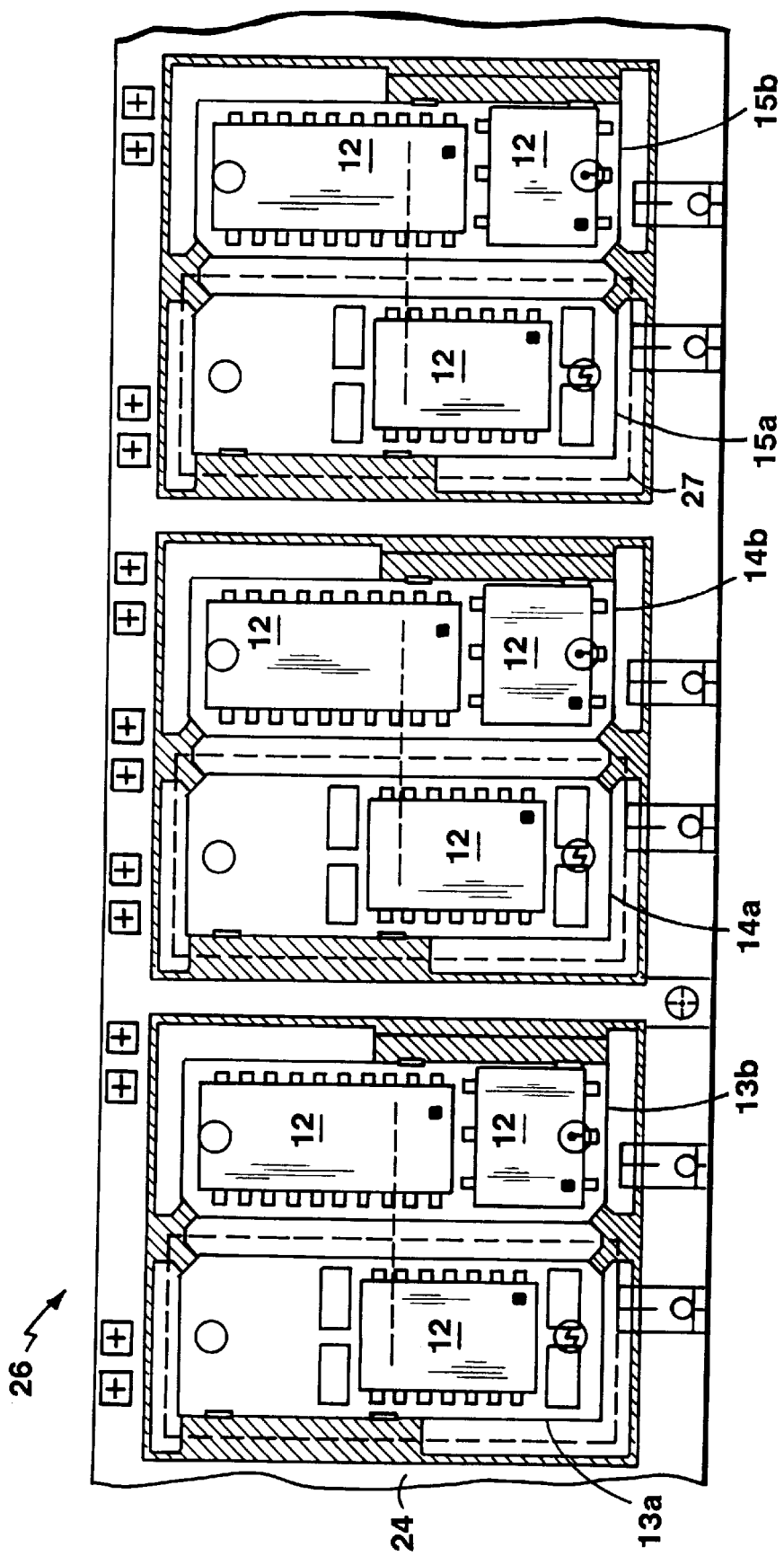
FIG. 2 is a top view of a multi-circuit assembly.
Figure 3:
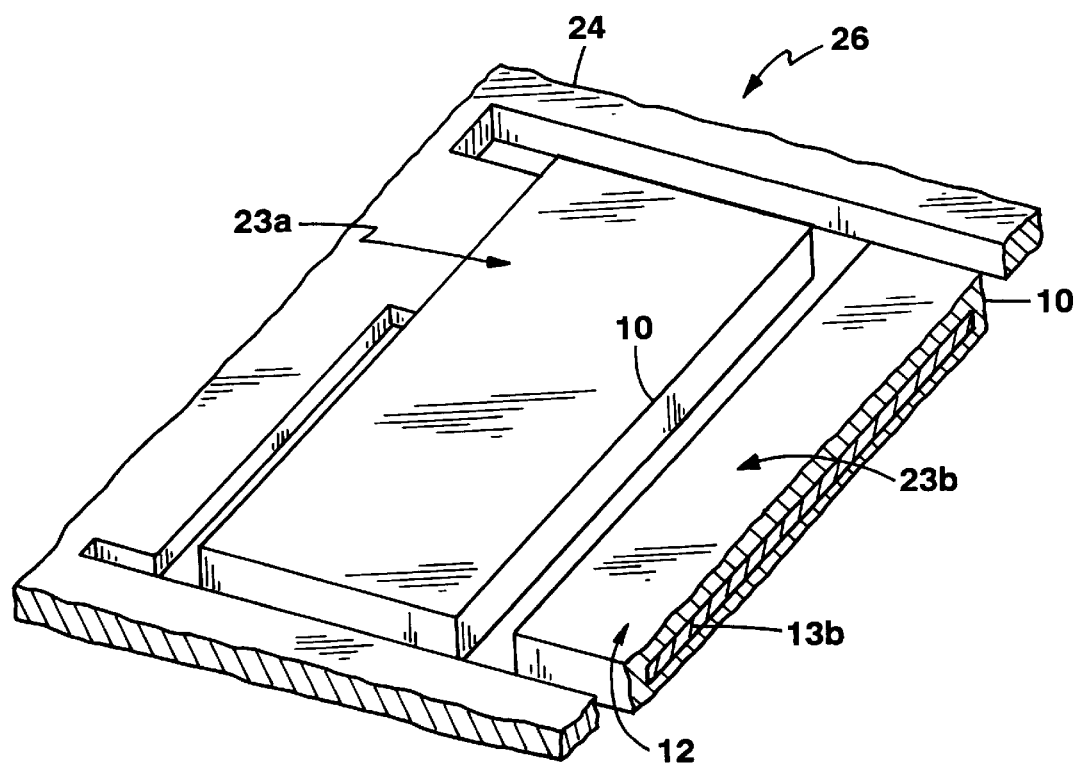
FIG. 3 is a perspective view of a fragment of the multi-circuit assembly of FIG. 2 after overmolding.

Referring to FIGS. 2 and 3, a pre-determined pattern 39 (pattern 39 is repeated along the length of an overmolding assembly 26, though the repetition is not shown in the Figure) of molding compound 10 (e.g., Novalac resin with fillers) is overmolded onto a multi-circuit assembly 24 consisting of several pairs of control circuit assemblies 13a, 13b; 14a, 14b; and 15a, 15b (of the kind described, for example, in above-noted U.S. patent application Ser. No. 08/077,011) located on a printed circuit board (PCB) 150. Each control circuit assembly includes one or more heat generating components 12. After overmolding, the pairs of overmolded circuit assemblies (e.g., pair 23a, 23b, FIG. 3) are cut away from the overmolded assembly 26 and the pairs (e.g., pair 23a, 23b) are assembled to form completed control assemblies 44 (FIG. 1).

Figure 4:
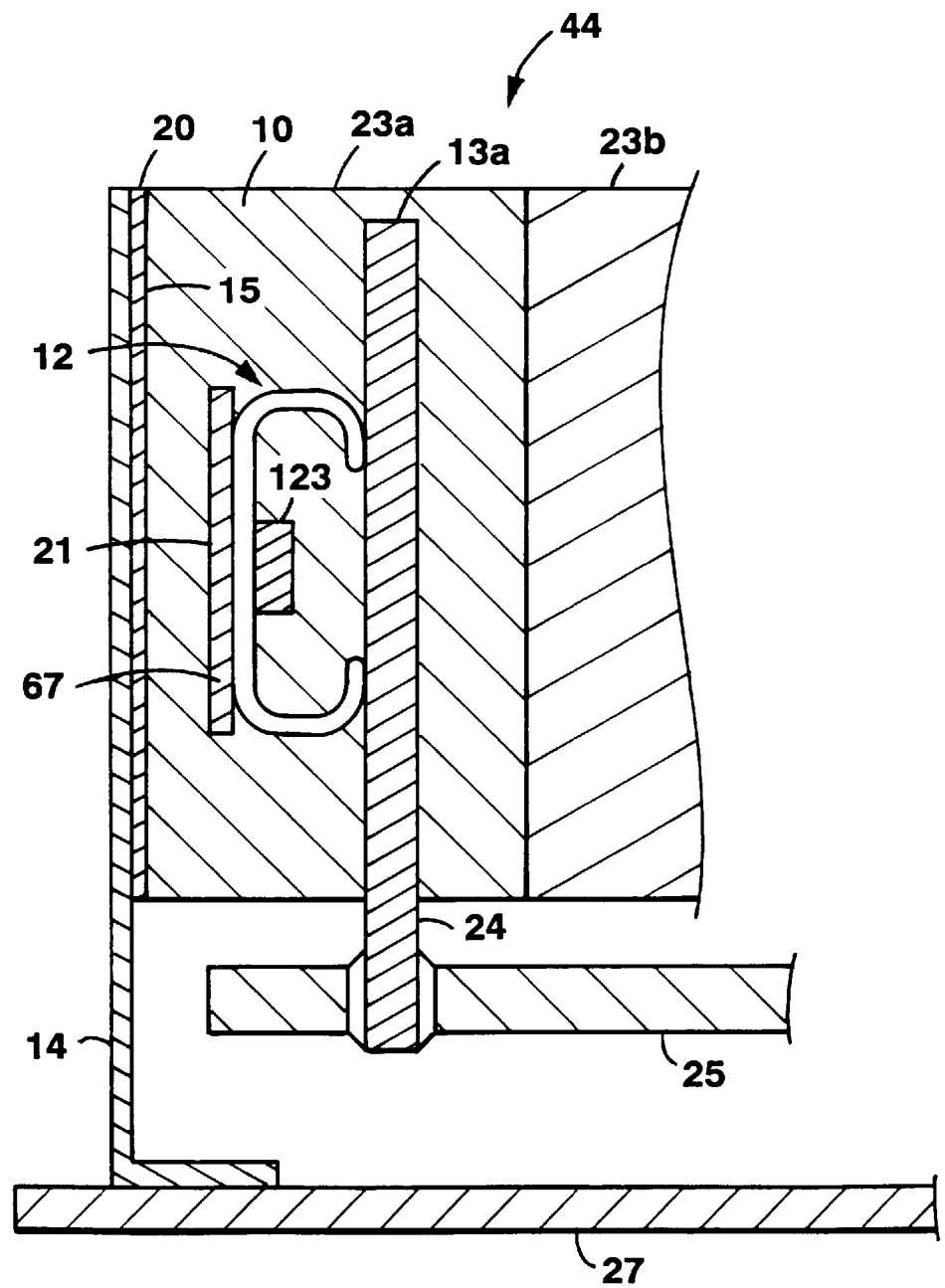
FIG. 4 is a cross-sectional side view (not to scale) of a thermally conductive drain connected to the side of an overmolded assembly.

FIG. 4 shows one way to thermally couple heat generating components 12 within the control assembly 44 to the metal shield 27 associated with the baseplate 52. As shown, a thermally-conductive heat drain 14 (e.g., copper) is glued to a side surface 15 of overmolded circuit assembly 23a and soldered or epoxied to the metal shield 27 using thermally conductive epoxy 20 (e.g., alumina filled 930-4 epoxy, manufactured by Epoxy Technology of Billerica, Mass.). Heat generated by components 12 (i.e., heat generated by semiconductor chip 123) passes from a surface 21 of a heat spreading, or conducting, plate 67 of component 12 through the molding compound 10 surrounding the component 12 prior to being conducted away by the drain 14. Since the thermal conductivity of typical molding compounds is much lower than the conductivity of copper (e.g., the thermal conductivity of Nitto MP 190 molding compound is 0.7 Watts/Meter*K, whereas the thermal conductivity of copper is 400 Watts/Meter*K) even thin cross sections of overmolding compound can add substantially to the thermal resistance in the thermally conductive path and promote the temperature rise of components 123. For example in a typical module 100 the outside dimensions of the control assembly 44 are 0.89" long×0.30" wide×0.34" high; 1 Watt of power is dissipated in component 12 having approximate surface dimensions 0.22"×0.35"; and the heat passes through 0.020" of Nitto MP 190 compound. As a result, the temperature rise in the component, owing to the molding compound 10 alone, is approximately 15 degrees Celsius.

Figure 5:
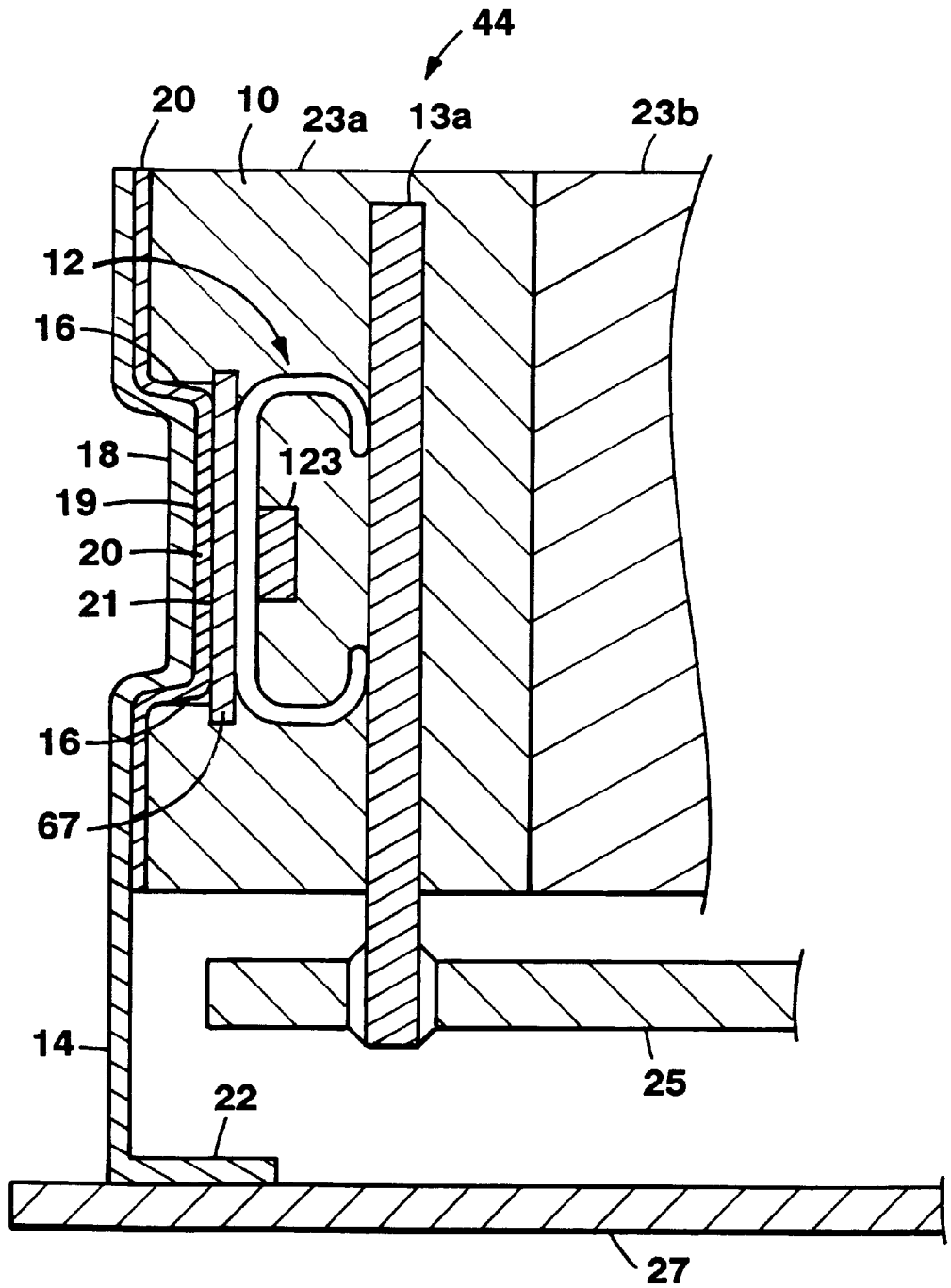
FIG. 5 is a cross-sectional side view (not to scale) of a thermally conductive drain connected to the surface of a component which is included within an overmolded assembly.

A way of improving the thermal coupling between components 12 in the control assembly 44 and the drain 14 is shown in FIG. 5. A laser has been used to remove encapsulant 10 from a region above surface 21 of component 12 to form a window 16. A dimple 18, stamped in drain 14, has dimensions similar to the dimensions of window 16, allowing the surface 19 of the drain 14 to be bonded using metal-laden epoxy 20 to the surface 21 of heat generating component 12. An end 22 of the drain 14 is soldered or epoxied to heat sinking conductive shield 27.

Figure 6:
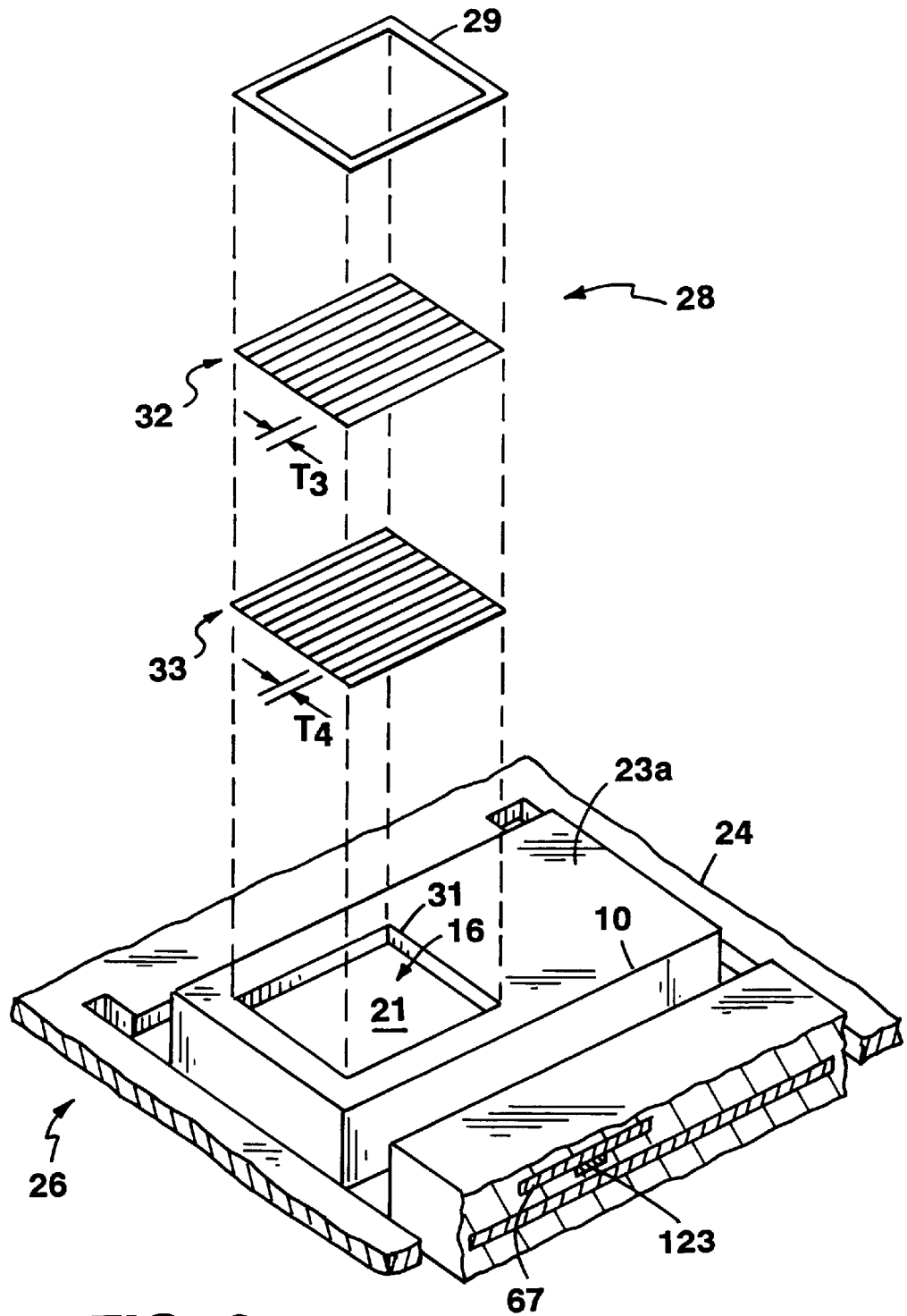
FIG. 6 is a perspective view of a portion of the overmolded circuit assembly of FIG. 3 after a window has been cut in the encapsulant.
Figure 7:
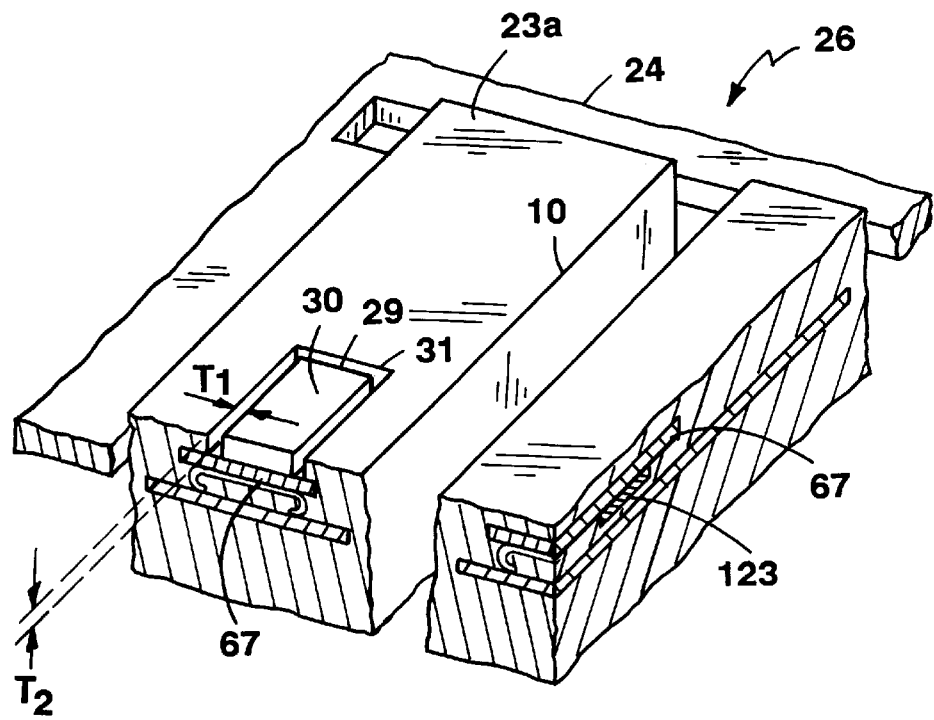
FIGS. 7 and 8 are cross-sectional perspective views of a portion of the overmolded circuit assembly of FIG. 3 in two stages of processing.

Referring to FIG. 6, the window 16 in encapsulant 10 may be laser-cut by a stroke marking laser (for example, model 60 watt Nd:YAG LME6000, manufactured by AB Laser, of Acton, Mass., although other stroke lasers may be used) using a series of predetermined laser patterns 28. Spatial patterns 29, 32 and 33 define the path that the laser beam takes when exfoliating material. In preparation for laser exfoliation, the overmolded assembly 26, containing heat generating components 12, is mounted in an alignment fixture (not shown) in the laser station. The first laser cut, as seen in FIG. 7, is a perimeter cut 29 which outlines an area 30 of encapsulant 10 to be exfoliated by the laser and thermally isolates the area 30 from the rest of encapsulant 10. In one example, perimeter cut 29 is 0.1 to 0.2 mm wide (T1) and as deep as the encapsulant is thick above the ceramic component, which is around 0.2 to 0.3 mm deep (T2). Typical laser settings for making such a perimeter cut 29 include two passes over the cut path at 150 mm/sec, 6 Khz, and 19.0 Amps (2.8 mm aperture; 3× up collimation; 100 mm lens). The outer edge 31 of perimeter cut 29 may be beveled (not shown) to provide stress relief to the cut edge.

Beveling is done using the same settings except that speed is increased to 400 mm/sec and the path location is set at the outer edge of the perimeter cut for a single pass.

Figure 8:
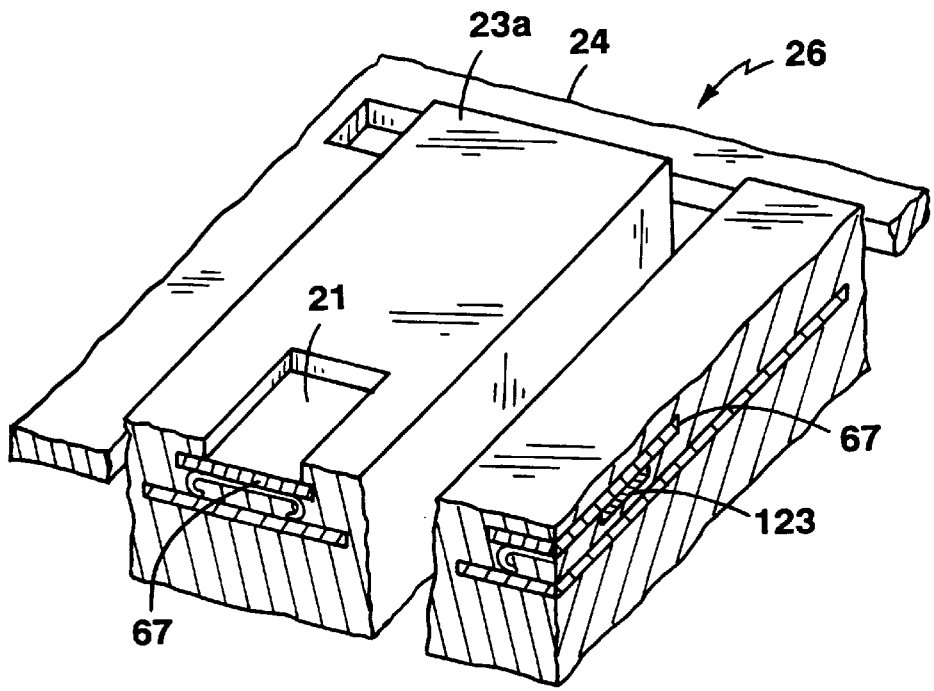

After perimeter cut 29, area 30 of encapsulant 10 may be laser exfoliated using one or more repetitions of a predetermined laser pattern (typically two) 32 and 33 (FIG. 6) to yield the finished window of FIG. 8. Laser pattern 32 is a series of parallel strokes, with a path spacing of 0.1 mm T3, that sequentially remove strips of encapsulant 10. Typical laser settings for laser pattern 32 include two passes at 1000 mm/sec, 20 Khz, and 19.0 Amps. Using the same path spacing of 0.1 mm T4, the second laser pattern 33 removes the remaining strips of encapsulant 10. Laser settings for laser pattern 33 include one pass at 2000 mm/sec, 50 Khz, and 19.0 Amps.

The heat dissipating surface 21 of heat generating component 12, that has been exposed by laser patterns 29, 32, 33, may be cleaned to remove all remaining traces of encapsulant 10 by applying a final laser pattern. This pattern may also be a series of parallel strokes. For this purpose, the laser may be set to pass once over the exposed portion of heat dissipating surface 21 at 2000 mm/sec, 50 Khz, and 19.0 Amps. or in continuous wave (CW) mode at the same speed and power level.

Figure 9:
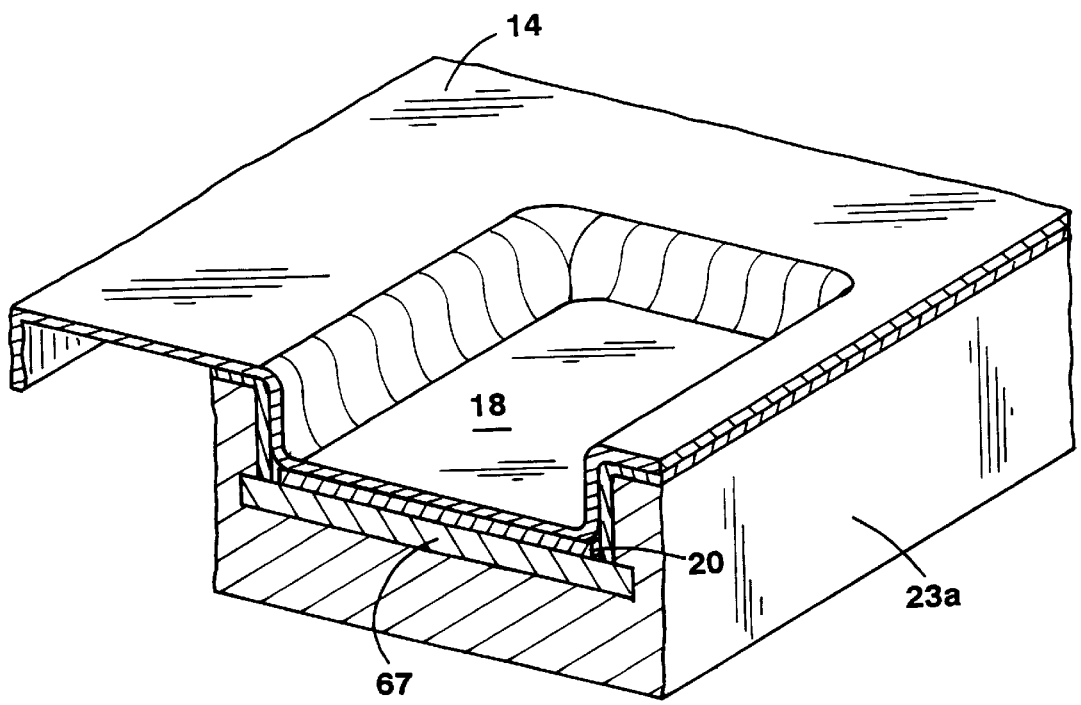
FIG. 9 is a cross-sectional perspective view of a fragment of the board of FIG. 2 with a thermally-conductive heat drain attached.

Referring to FIG. 9, as discussed, the thermally conductive heat drain 14 may be attached to the exposed portion of heat dissipating surface 21 using metal-laden epoxy 20.

As shown in FIGS. 11–14, in addition to exfoliation, the laser is used to precisely remove, or trim, portions of the molding from around the perimeter of each of the overmolded circuit assemblies, such as, for example, assembly 23a. For purposes of trimming, the laser follows one pattern 168 to cut and remove molded flashing 163 and other patterns 164 and 166 to set the final outside dimensions of the finished part (i.e., the circuit assembly 23a after trimming.) If the laser is used for this purpose, the dimensional tolerances of the mold cavities may be relaxed, resulting in lower cost molds, longer mold life (i.e., more mold wear can be accommodated, thereby allowing more parts to be produced) and less mold maintenance. Once the molded flashing 163 is removed and the dimensions of the part are set, the laser is guided over other patterns 170 and 172 to cut through and remove the assembly 23a from portions of the PCB 150.

In order to trim the circuit assembly 23a, the laser cuts through the molding material as well as portions of the PCB 150. The circuit assembly 23a is connected to the PCB 150 near three faces 151, 182, and 186 of the assembly 23a. The remainder of the circuit assembly 23a is isolated from the PCB 150. Molded flashing 160 (part of the molded flashing 163) extends between the two circuit assemblies 23a and 23b.

The beam projected by the laser used for trimming is substantially perpendicular to the plane of the PCB 150 and imparts a vertical face 162 around the faces of the circuit assembly 23a that are cut. The face 162 formed by the laser removes an inclined face 161 (referred to as a draft angle edge) formed by the molding process. Typical laser settings for the patterns 164–172 are 1000 mm/s, 6 Khz, and 20 Amps. For purposes of preventing the molding compound 10 from cooling during cutting by the laser, the laser doubles back on the patterns 164–172. Thus, when an end of the pattern is reached, the laser traces back over the pattern beginning with that end.

For purposes of removing the molded flashing 163 from the circuit assembly 23a, the laser follows the pattern 168 which traces a perimeter 183 of the circuit assembly 23a. The laser traverses the pattern 168 six times. The perimeter 183 includes portions around the assembly 23a where the molded flashing 163 has been formed and excludes an edge 151 of a circuit board 152 extending from the circuit assembly 23a where molded flashing 163 is absent.

In order to precisely dimension the finished part (as measured between two parallel faces 180 and 184), one face 180 of the circuit assembly 23a is trimmed using the straight line laser pattern 164. The laser traverses the pattern 164 twenty times. The tolerance of the circuit assembly 23a is set by trimming the face 184 using another straight line laser pattern 166 until the faces 180 and 184 are located a predetermined distance A apart. The trimming along the face 184 separates the circuit assembly 23a from the molded flashing 160 existing between the two circuit assemblies 23a and 23b. The laser traverses the laser pattern 166 thirty times.

To complete the trimming by the laser, the laser cuts through the PCB 150 near the faces 182 and 186, using straight line patterns 172 and 170, respectively. The laser traverses each of the patterns 170 and 172 twenty times.

The circuit assembly 23a is then removed from the PCB 150 by punching which separates the section (at its edge 151) from the remaining PCB 150. Other overmolded circuit assemblies are trimmed by the laser in a similar fashion.

Other embodiments are within the scope of the following claims. For example, window 16 in encapsulant 10 may be created by first precoating the surfaces 21 of the heat generating components 12 with a mold release compound or equivalent non-stick material (for example, a PTFE release agent dry lubricant (not shown), made by Miller-Stephenson Chemical Co. of Danbury, Conn.) before applying encapsulant 10. The mold release compound prevents encapsulant 10 from adhering to the heat dissipating surface 21 of the component 12. Perimeter cut 29 (FIG. 7) is then made in encapsulant 10 (as described above) to outline an area 30. This area 30 of encapsulant 10 can be dislodged by passing compressed air over the surface of the overmolded circuit assembly 23a, thereby forming the window 16 over the surface 21 of the component 12.

If the heat conducting plate 67 (FIG. 5) is made of a material, such as alumina ceramic, having a surface to which a solderable material can be bonded (such as by plating copper onto the surface or using a direct-bond copper process), then the drain 14 can be soldered to the exposed surface 21 of the component 12 after the surface has been exfoliated.

Figure 10:
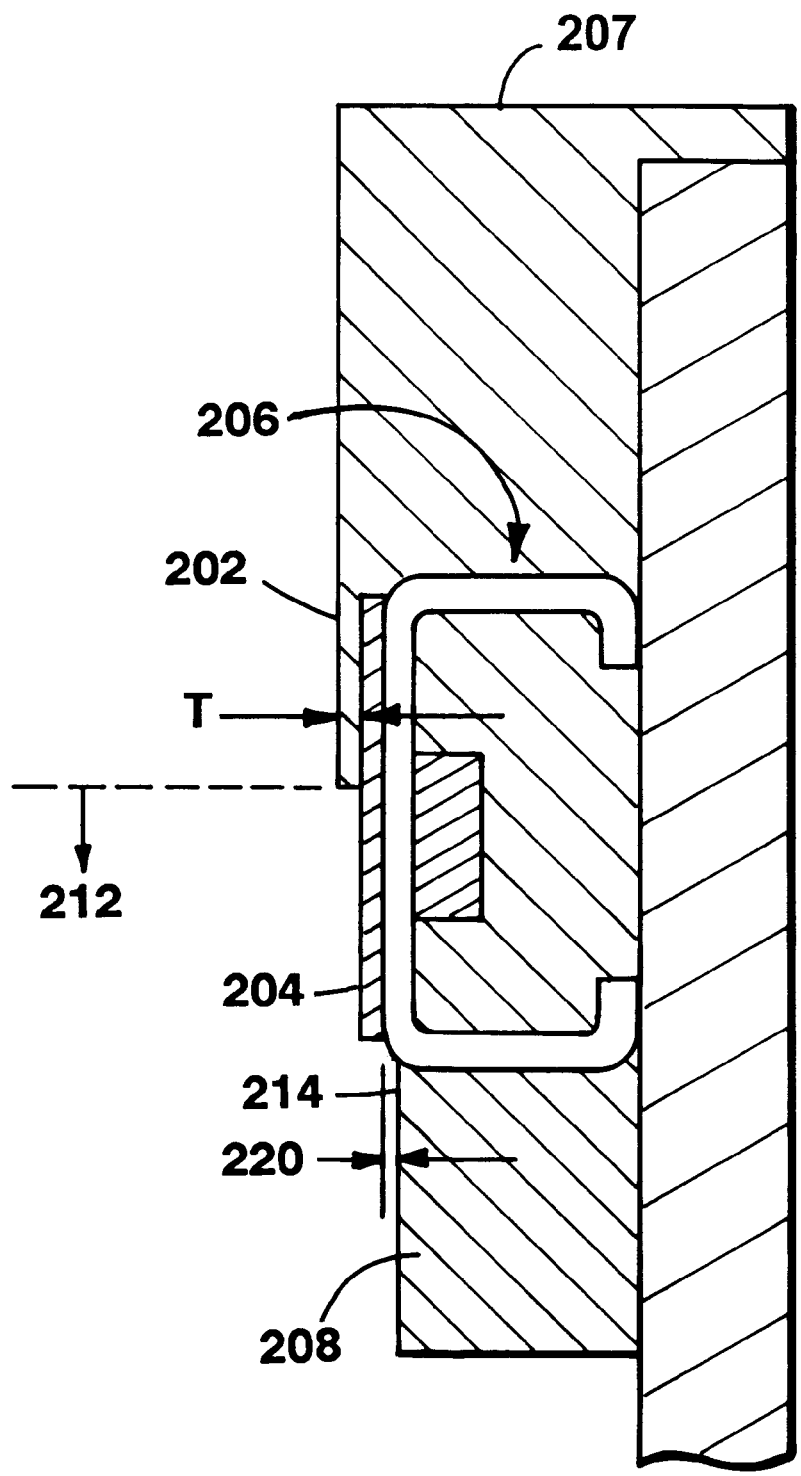
FIG. 10 is a cross-sectional side view of a portion of an overmolded assembly before and after processing.
Figure 11:
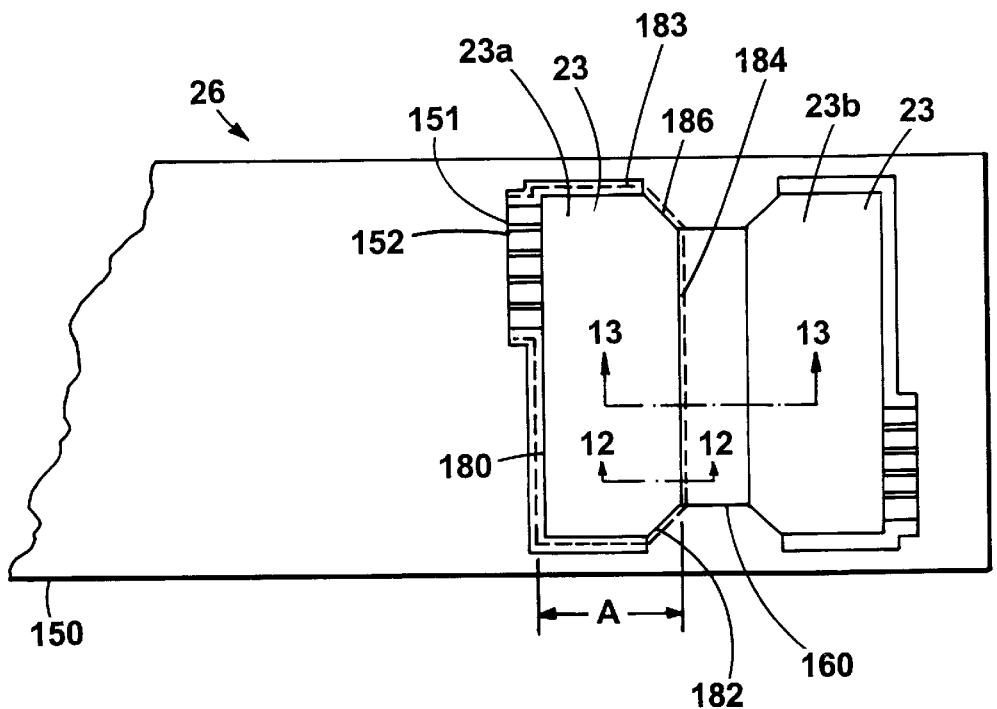
FIG. 11 is a top view of a multi-circuit assembly after overmolding.
Figure 12:
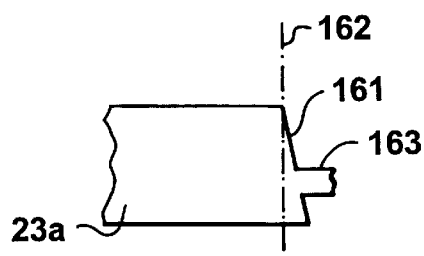
FIG. 12 is a cross-sectional view of the multi-circuit assembly taken along line 12—12 of FIG. 11.
Figure 13:
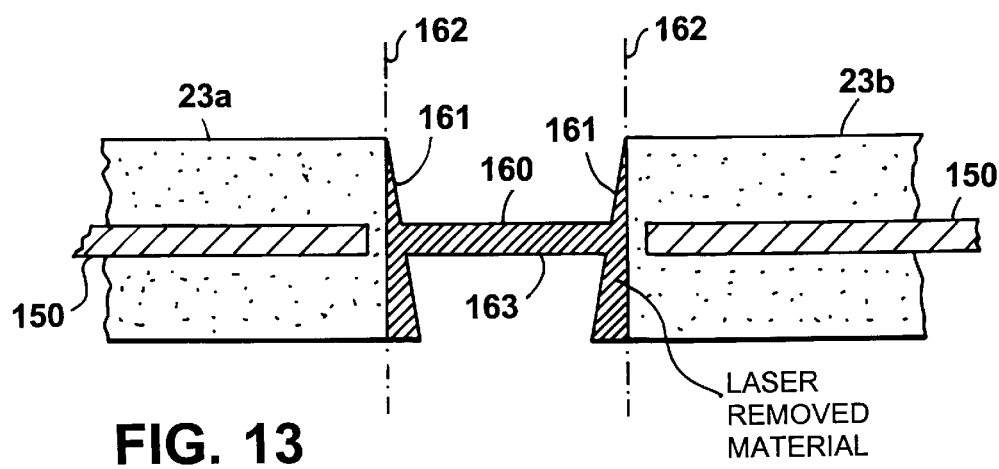
FIG. 13 is a cross-sectional view of the multi-circuit assembly of FIG. 11 taken along line 13—13 of FIG. 11.
Figure 14:
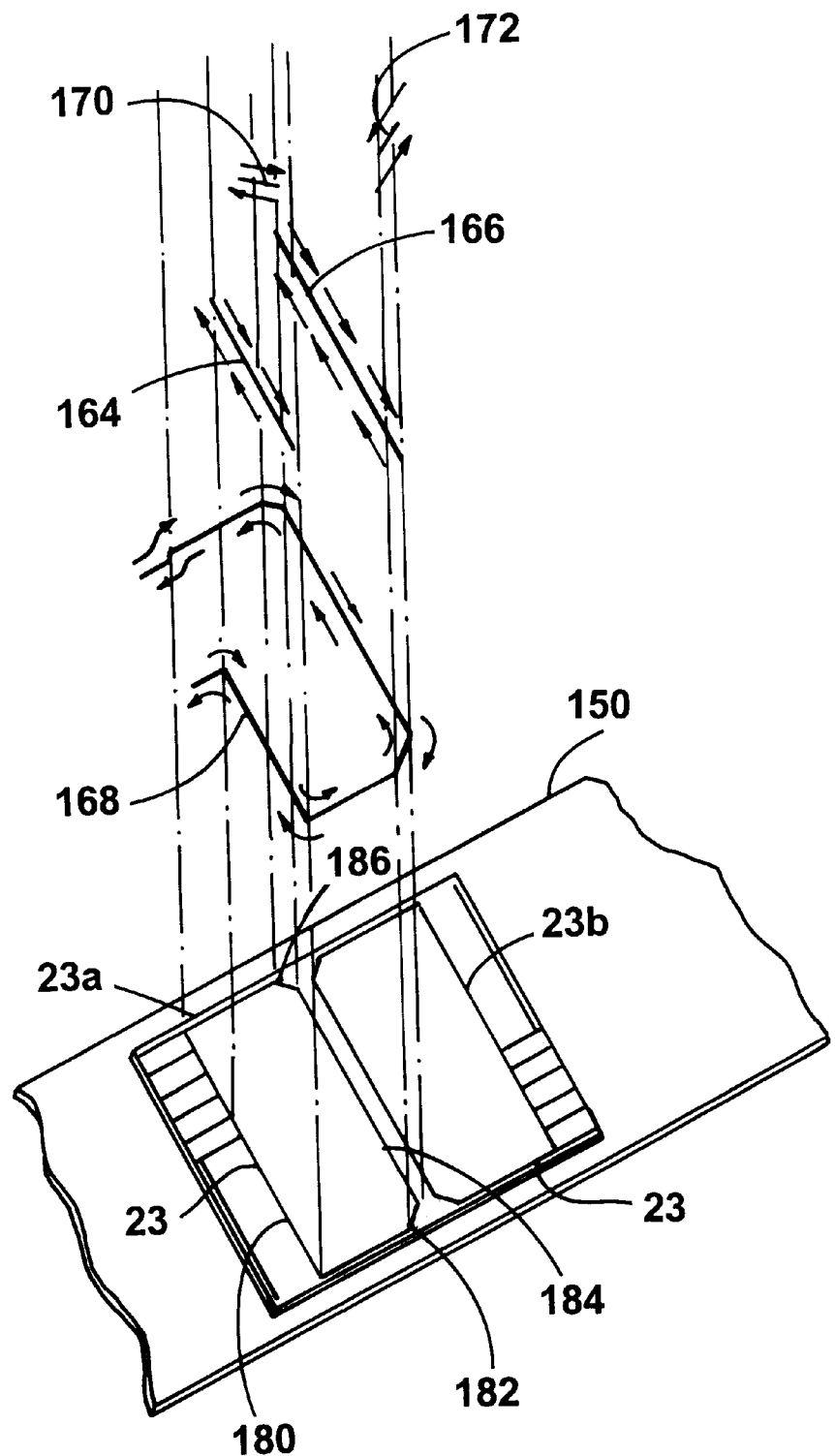
FIG. 14 is a perspective view of laser patterns used to trim the multi-circuit assembly.

In another processing approach, shown in FIG. 10, the laser is scanned using a marking pattern with the same shape as entire surface 202 of the overmolded circuit assembly 207 (e.g.. overmolded circuit assembly 23a), rather than only a small rectangular window. The pattern exposes the whole top surface 204 of ceramic heat generating component 206. Because the white ceramic has different reflectivity characteristics than the encapsulant material 208, the laser can be configured to strip away the encapsulant and leave the white ceramic unharmed. The resulting exfoliated surface (shown in the bottom half 212 of FIG. 10) has the white ceramic surface slightly protruding from the top, or fresh, surface 214 of the encapsulant. Using this technique, the ceramic surface can be quite close to the inner surface of the mold during encapsulation (e.g., a thickness T as little 0.001 to 0.003 inches).

Among the advantages of this approach are the following. The need for location accuracy of the window cut outs is eliminated because the entire surface 202 is cleaned away. Also, the heat conducting drain now may be made easily from a flat piece of material. Tolerance requirements are eliminated for dimple features such as depth and size. A gap 220 equivalent to the distance the ceramic protrudes from the encapsulant is automatically available for the drain attachment adhesive to fill. Allowing a thick adhesive joint (e.g., 0.001 to 0.003 inches) to form around the drain to ceramic interface eliminates the potentially high sheer stress in the adhesive joint caused if the adhesive layer being too thin.

Other laser cutting schemes could be used for exfoliation, including a mask marker $CO_2$ laser.

What is claimed is:

1. A method of attaching a thermally conductive feature to an electronic component for making a thermally conductive connection between a heat sink and the electronic component, comprising:

encapsulating the heat generating component within an encapsulant;

making a recessed window in the encapsulant to expose a heat dissipating surface of the heat generating component using a laser; and attaching the thermally conductive feature to the encapsulated heat generating component through the window in the encapsulant.

2. The method of claim 1 wherein making a window in the encapsulant comprises making a perimeter cut with the laser to outline the area of encapsulant to be removed and removing the outlined area of encapsulant.

3. The method of claim 2, wherein removing the outlined area of encapsulant comprises peeling the encapsulant away from the surface of the heat generating component.

4. The method of claim 3, wherein peeling the encapsulant comprises passing compressed air over the surface of the encapsulant until the encapsulant dislodges from the heat generating component.

5. The method of claim 1, wherein making a window further comprises removing encapsulant using compressed air.

6. The method of claim 1 wherein making a window further comprises exposing the heat-dissipative surface bounded by a fresh surface of the encapsulant.

7. The method of claim 6 in which the fresh surface of the encapsulant is recessed below the heat dissipating surface.

8. The method of claim 6 wherein the attaching further comprises bonding the thermally conductive feature to the fresh surface with the heat sinking element in contact with the heat-dissipating surface.

9. The method of claim 1, 4, 6, or 7 wherein the attaching comprises applying epoxy.

10. The method of claim 9 wherein the epoxy is metal laden.

11. The method of claim 1, 4, 6, or 7 wherein the attaching comprises soldering.

12. The method of claim 1, 4, 6, or 7 wherein the heat-dissipative surface comprises a ceramic material.

13. The method of claim 12 wherein the attaching comprises direct copper bonding.

14. The method of claim 1, 4, 6, or 7 further comprising:

trimming a face of the module using a laser, wherein the trimming includes removing molded flashing from the module and removing a portion of the encapsulated circuit in a plane substantially parallel to the molded flashing.

15. The method of claim 1, 4, 6, or 7 further comprising coating a surface of the heat generating component with mold release material before the encapsulating.

16. The method of claim 15, wherein mold release material comprises PTFE.

17. The method of claim 1, 4, 6, or 7 wherein the thermally conductive feature further comprises a dimple with dimensions similar to that of the window in the encapsulant.

* * * * *